United States Patent
Sakakibara et al.

(10) Patent No.: US 6,225,548 B1
(45) Date of Patent: May 1, 2001

(54) THERMOELECTRIC SEMICONDUCTOR COMPOUND AND METHOD OF MAKING THE SAME

(75) Inventors: Tsutomu Sakakibara, Toyota; Takanori Imoto, Sakai; Yasuo Takigawa, Hirakata, all of (JP)

(73) Assignee: Aisin Seiki Kabushiki Kaisha, Kariya (JP)

( * ) Notice: Subject to any disclaimer, the term of this patent is extended or adjusted under 35 U.S.C. 154(b) by 0 days.

(21) Appl. No.: 09/447,951

(22) Filed: Nov. 29, 1999

(30) Foreign Application Priority Data

Nov. 27, 1998 (JP) .................................................. 10-336930

(51) Int. Cl.$^7$ .................................................. H01L 35/34
(52) U.S. Cl. ...................... 136/201; 136/236.1; 136/238; 136/240; 136/241
(58) Field of Search .................................. 136/201, 203, 136/205, 236.1, 238, 240, 241

(56) References Cited

U.S. PATENT DOCUMENTS

| | | | |
|---|---|---|---|
| 3,095,330 | * 6/1963 | Epstein et al. ............................ | 136/5 |
| 4,489,742 | 12/1984 | Moore et al. ......................... | 136/203 |
| 4,497,973 | 2/1985 | Heath et al. .......................... | 136/212 |
| 5,763,293 | 6/1998 | Yamashita et al. .................... | 438/55 |

FOREIGN PATENT DOCUMENTS 10-242535    9/1998 (JP) .

OTHER PUBLICATIONS

I. Ohnaka et al. "Thermoelectric Properties of $(Bi_{0.25}Sb_{0.75})_2Te_3$ with Ceramic Addition", Proc. XII Int. Conf. On Thermoelectric, IEEJ, Tokyo, Yokohama, pp. 121–125, 1994.

* cited by examiner

Primary Examiner—Kathryn Gorgos
Assistant Examiner—Thomas H Parsons
(74) Attorney, Agent, or Firm—Oblon, Spivak, McClelland, Maier & Neustadt, P.C.

(57) ABSTRACT

A thermoelectric semiconductor compound is provided whose performance index Z is remarkably improved without sacrificing Seebeck coefficient, electrical conductivity or thermal conductivity. The thermoelectric semiconductor compound includes a first thermoelectric semiconductor which is in the form of matrix and a second thermoelectric semiconductor which is in the form of particles dispersed in the matrix. The first thermoelectric semiconductor and the second thermoelectric semiconductor have a common element. The average diameter D of the dispersed particles complies with a formula of A<D<B, where A is the mean free path of a carrier in a single crystal of the second thermoelectric semiconductor and B is the mean free path of a long wave length phonon in the single crystal of the second thermoelectric semiconductor. A method for making the a thermoelectric semiconductor compound is provided.

15 Claims, 8 Drawing Sheets

Fig. 1

SAMPLE E2 (X1000)
FIG. 3

SAMPLE E1 (X1000)
FIG. 4

SAMPLE E3 (X1000)

FIG. 5

SAMPLE E3 (X100)

THERMOELECTRIC SEMICONDUCTOR COMPOUND AND METHOD OF MAKING THE SAME

BACKGROUND OF THE INVENTION

1. Field of the Invention

The present invention is directed to a thermoelectric semiconductor compound and a method of making the thermoelectric semiconductor compound.

2. Description of Related Art

It is well known that thermoelectric semiconductor compounds exhibit the Seebeck effect, where heat is converted to electricity, and the Peltier effect, where application of an electric current causes cooling or heating.

The thermoelectric performance of a thermelectric semiconductor compound is indicated by a performance index Z ($=\alpha^2\sigma/\kappa$, where $\alpha$ is the Seebeck coefficient, $\sigma$ is the electrical conductivity, and $\kappa$ is the thermal conductivity). A higher performance index Z results in higher thermoelectric performance. For example, a higher performance index Z results in a higher voltage being developed if a temperature difference is provided across a thermoelectric semiconductor. A higher performance index Z also results in a larger temperature difference being developed across a thermoelectric semiconductor upon application of an electric current. Thus, much research and development effort has focused on increasing the performance index Z to as high a value as possible.

One improved thermoelectric semiconductor compound is disclosed in Japanese Laid-open Patent No. Hei. 10-242535, which was published, without examination, on Sep. 11, 1998. The performance index Z was increased by adding BN to a thermoelectric semiconductor with a molecular formula of $(Bi_2Te_3)_{70}(Sb_2Se_3)_5$ or $(Bi_2Te_3)_{70}(Sb_2Se_3)_{30}$, even though the addition of BN led to a reduction in thermal conductivity.

Another improved thermoelectric semiconductor compound is disclosed in Proc. XII Int. Conf. On Thermoelectric, IEEJ, Tokyo, Yokohama (Japan), pp.121–125, 1994. The performance index Z was increased by a factor of 1.2 by the addition of 2 volume % MgO, in the form of powders having an average diameter of 0.01 $\mu$m, to a thermoelectric semiconductor having a molecular formula of $(Bi_{0.25}Sb_{0.75})_2Te_3$.

In both cases, the performance index Z of a thermoelectric semiconductor compound was increased by the addition of a dielectric material that also decreased the electrical conductivity. Thus, the increases in the performance index Z resulted from an improvement in one or more of $\alpha$ and $1/\kappa$, while $\sigma$ was sacrificed. As long as improvements in the performance index Z require a trade-off of one or more of the factors of Z, improvements in Z will be limited.

Accordingly, a need exists for a thermoelectric semiconductor compound with a remarkably improved performance index Z that is not the result of sacrificing one of the factors of Z.

SUMMARY OF THE INVENTION

The present invention has been developed to satisfy the need noted above and thus has as a primary object the provision of a thermoelectric semiconductor compound which comprises:

a first thermoelectric semiconductor which is in the form of a matrix; and a second thermoelectric semiconductor which is in the form of particles dispersed in the matrix, the first thermoelectric semiconductor and the second thermoelectric semiconductor having a common element, an average diameter D of the dispersed particles complying with a formula of A<D<B where A is the mean free path of a carrier in a single crystal of the second thermoelectric semiconductor and B is the mean free path of a long wavelength phonon in the single crystal of the second thermoelectric semiconductor.

BRIEF DESCRIPTION OF THE DRAWINGS

The above and other objects, features and advantages of the present invention will be more apparent and more readily appreciated from the following detailed description of preferred exemplary embodiments of the present invention, taken in connection with the accompanying drawings, in which.

DETAILED DESCRIPTION OF THE PRESENT INVENTION

Preferred embodiments of the present invention will be described hereinafter in detail with reference to the accompanying drawings.

Figure 1:
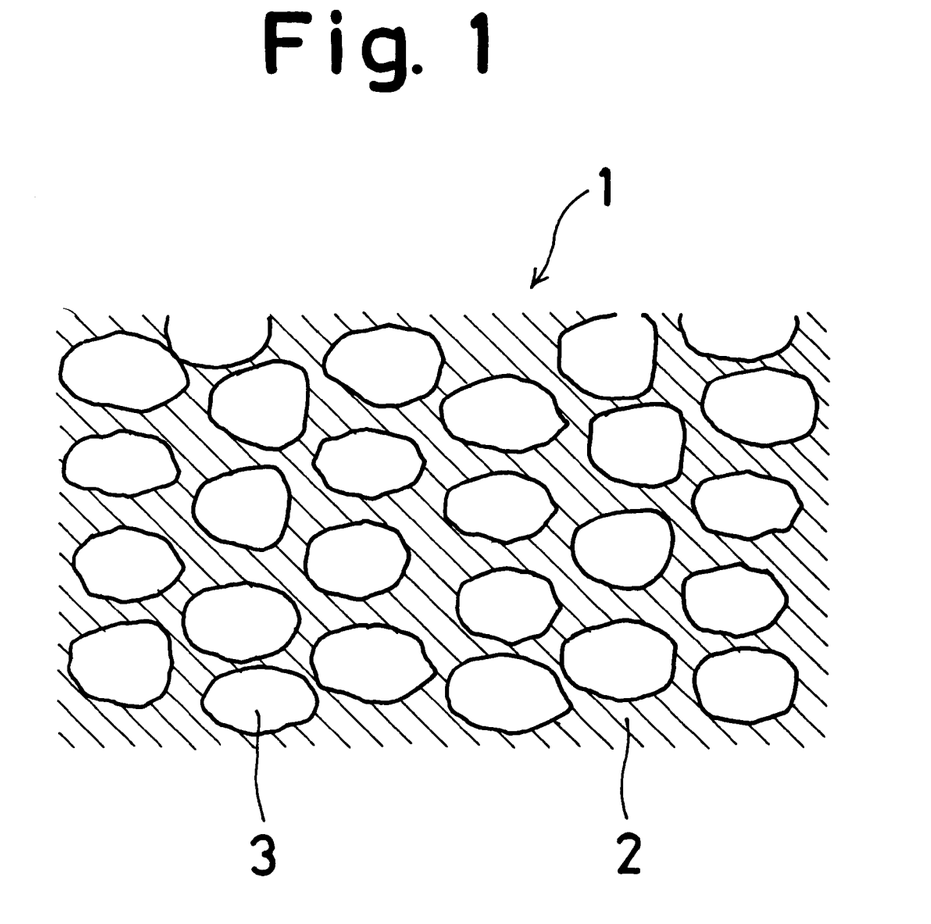
FIG. 1 is a conceptual view showing the microstructure of a thermoelectric semiconductor compound in accordance with a first embodiment of the present invention.

In accordance with a first embodiment of the present invention, FIG. 1 shows a thermoelectric semiconductor compound 3 including a first thermoelectric semiconductor 1, which is in the form of a matrix, and a second thermoelectric semiconductor 2, which is in the form of particles dispersed in the matrix. The first thermoelectric semiconductor 1 and the second thermoelectric semiconductor 2 have a common element, and an average diameter D of the dispersed particles complies with a formula of A<D<B, where A is the mean free path of a carrier in a single crystal of the second thermoelectric semiconductor 2 and B is the mean free path of a long wavelength phonon in the single crystal of the second thermoelectric semiconductor 2.

For example, the first semiconductor 1 can be a member of the $BiTe_3$ family of semiconductors. In particular, the first thermoelectric semiconductor 1 can be $AgBiTe_2$, in which case the second thermoelectric semiconductor 2 can be $Ag_2Te$. In this case, the common element of the first thermoelectric semiconductor 1 and the second thermoelectric semiconductor 2 is Te. The ratio of $AgBiTe_2$ is approximately 1:1:2. Such a ratio includes errors which occur inevitably in production processes. Similarly, the ratio of $Ag_2Te$ is about 1:2.

The Seebeck coefficient of $AgBiTe_2$ is $-104$ $\mu V/K$, which is larger in absolute value than the Seebeck coefficient of $Ag_2Te$ of $-88$ $\mu V/K$.

The melting point of the first thermoelectric semiconductor, $AgBiTe_2$, is 555° C., which is lower than the melting point of the second thermoelectric semiconductor, $Ag_2Te$, of 960° C.

The second thermoelectric semiconductor 2, which is in the form of particles, has an average diameter D has 10 $\mu$m. This complies with the foregoing formula of A<D<B, because the mean free path A of a free electron as the carrier in the single crystal of the second thermoelectric semiconductor 2 is on the order of 0.01 $\mu$m and the mean free path B of a long wavelength phonon in the single crystal of the second thermoelectric semiconductor 2 is about 100 $\mu$m.

Figure 2:
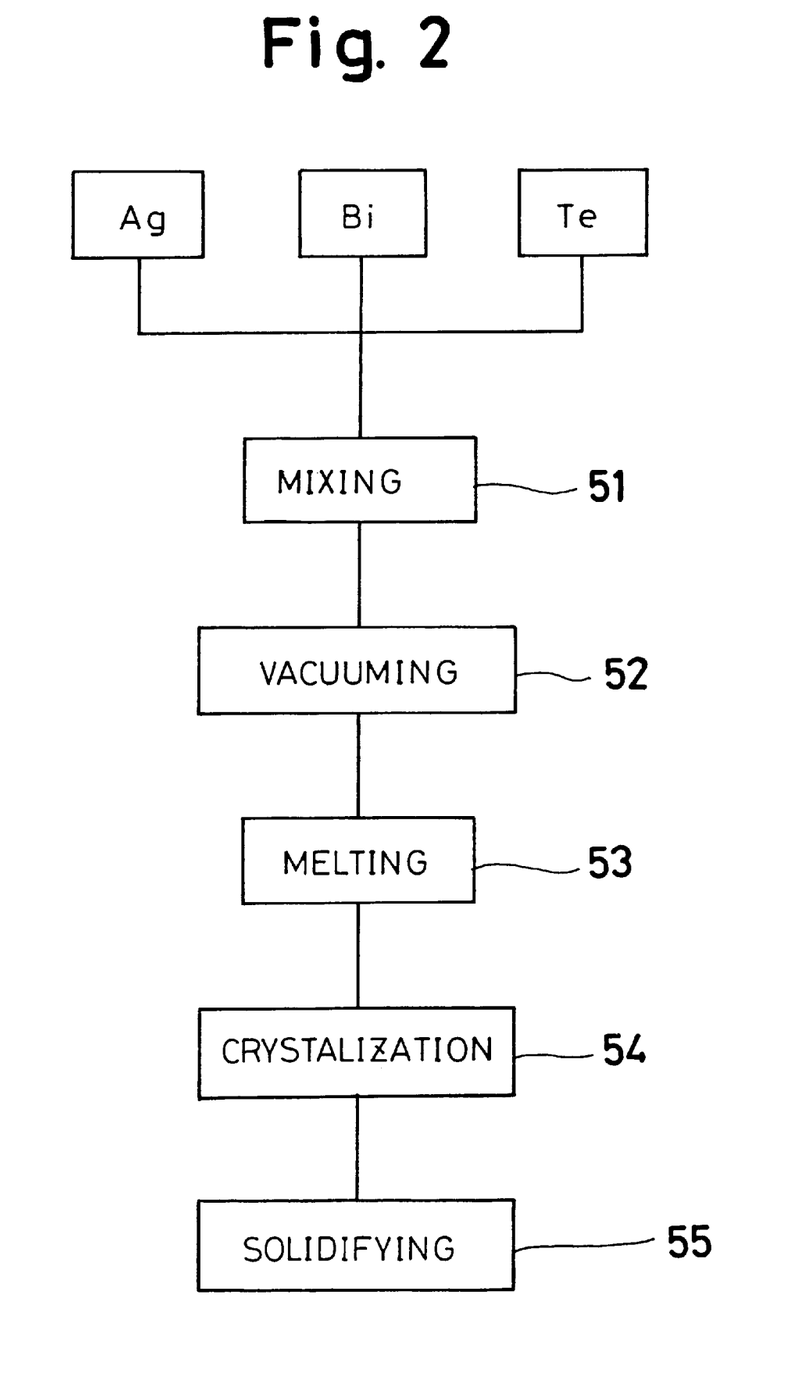
FIG. 2 is a process chart showing steps for making a thermoelectric semiconductor compound in accordance with the first embodiment of the present invention.

FIG. 2 shows a process for producing the thermoelectric semiconductor compound 3 having the foregoing chemical structure. The first thermoelectric semiconductor and the second thermoelectric semiconductor are mixed at a ratio of 1:1, thereby producing a mixture (mixing step 51). In detail, an amount of Ag having a purity of 99.999%, an amount of Bi having a purity of 99.999%, and Te having a purity of 99.999% are blended so as to constitute a composition ratio of $AgBiTe_2$ and $Ag_2Te$ of 50:50.

Next, the mixture produced at the mixing step 51 is put into an inner space of a quartz tube and maintained or kept under a vacuum of $10^{-3}$ Pa (Vacuum step 52).

Subsequently, the mixture in the quartz tube is melted in such a manner that the quartz tube in motion is warmed at a temperature of 1100° C. for 100 hours (melting step 53).

After completion of the melting step 53, the resultant or melted mixture is cooled gradually to a temperature of 650° C., which is higher than the melting point of the first thermoelectric semiconductor and lower than the melting point of the second thermoelectric semiconductor, thereby crystallizing $Ag_2Te$ (the second thermoelectric semiconductor) evenly in the melted mixture (crystallization step 54).

Thereafter, the quartz tube in which the resultant or semi-melted state mixture with the crystallized condition maintained is immersed into water to cool the quartz tube rapidly. Thus, the mixture is cooled to a temperature less than the melting point of the first thermoelectric semiconductor, thereby solidifying the mixture rapidly (solidifying step 55).

The resulting thermoelectric semiconductor compound 3 (hereinafter called sample E1), as shown in FIG. 1, comprises the first thermoelectric semiconductor 1, which is in the form of a matrix, and the second thermoelectric semiconductor 2, which is dispersed in the matrix as particles.

Due to the fact that each of the particles 2 has a chemical structure of $Ag_2Te$, unlike the conventionally employed dielectric material, the particles 2 fail to lower the electrical conductivity of the thermoelectric semiconductor compound 3. In addition, the average diameter D of the particle 2 falls in the foregoing range, which causes a phonon scatter at an interface between the particle 2 and the matrix 1, thereby decreasing the thermal conductivity of the thermoelectric semiconductor compound 3.

Moreover, the common element Te strengthens the chemical bond between the matrix 1 and the particle 2, with the result that the current loss at the interface between the particle 2 and the matrix 1 is decreased as small as possible, thereby preventing the lowering of the electrical conductivity. The strengthened chemical bond contributes to increase the mechanical strength of the thermoelectric semiconductor compound 3.

In the thermoelectric semiconductor compound in accordance with the first embodiment of the present invention, only the thermal conductivity is lowered without decreasing the electrical conductivity, so that the performance index Z is improved remarkably.

In addition to the sample E1, two other samples E2 and E3 are produced in the same manner as sample E1 but with different composition ratios. In sample E2, a composition ratio between ($AgBiTe_2$) and ($Ag_2Te$) is 75:25, while in sample E3, a composition ratio between ($AgBiTe_2$) and ($Ag_2Te$) is 25:75.

Figure 3:
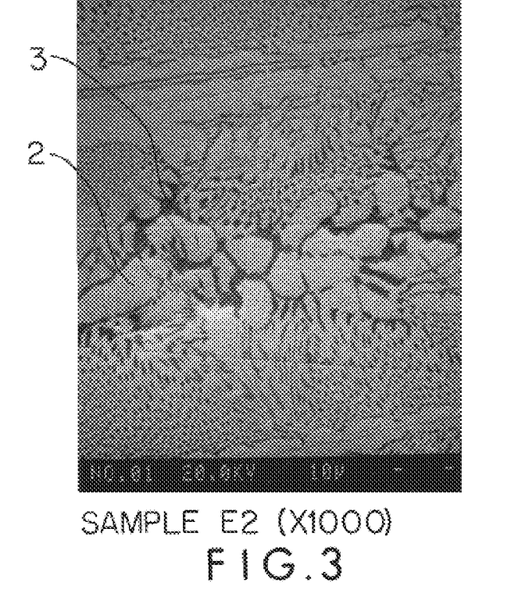
FIG. 3 is a microphotograph of the crystal structure of a sample E2 of a thermoelectric semiconductor compound in accordance with a second embodiment of the present invention.
Figure 4:
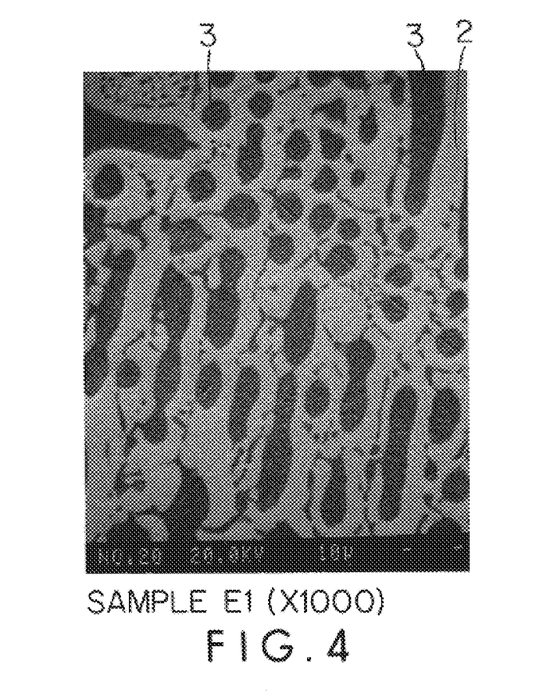
FIG. 4 is a microphotograph of the crystal structure of a sample E1 of the thermoelectric semiconductor compound in accordance with a second embodiment of the present invention.
Figure 5:
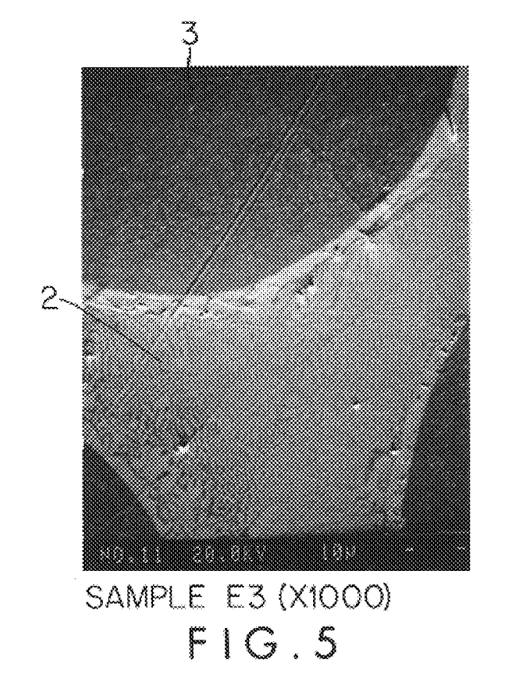
FIG. 5 is a microphotograph of the crystal structure of a sample E3 of the thermoelectric semiconductor compound in accordance with a second embodiment of the present invention.
Figure 6:
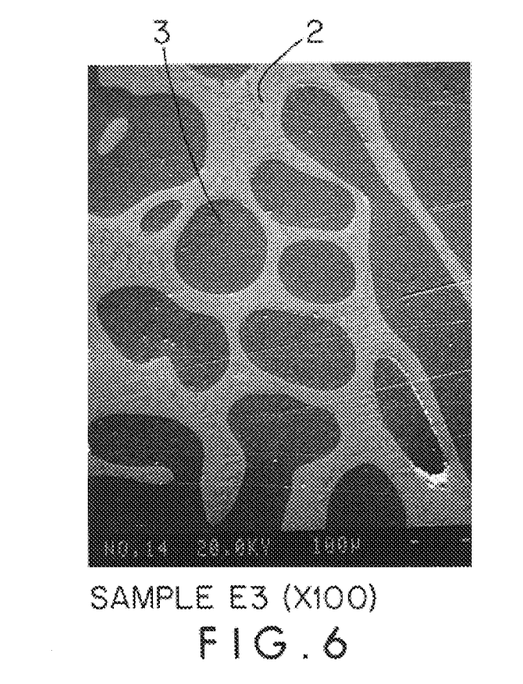
FIG. 6 is a microphotograph of the crystal structure of a sample E3 of the thermoelectric semiconductor compound in accordance with a second embodiment of the present invention.

The samples E1, E2, and E3 are inspected using an electron microscope wherein a reflected electron image of each of the samples E1, E2, and E3 is observed. FIG. 3 shows the resulting microphotograph of the sample E2 at a magnification of X1000. FIG. 4 shows the resulting microphotograph of the sample E1 at a magnification of X1000. FIG. 5 shows the resulting microphotograph of the sample E3 at a magnification of X1000. FIG. 6 shows the resulting microphotograph of the sample E3 at a magnification of X100 and lower.

In each of the microphotographs, a whitish part indicates the matrix 1 and blackish parts indicate the particles 2.

The average diameters of the particles in samples E1, E2, and E3 are about 1 um, about 10 $\mu$m, and about 100 $\mu$m, respectively.

Such measurements reveal that when large amounts of the particles of the second thermoelectric semiconductor are present, the average diameter of the particles is larger.

Next, thermoelectric characteristics of the samples E1, E2, and E3, respectively, are measured together with a Comparative Example C1, which has a chemical structure of $AgBiTe_2$, like the matrix 1 of the first semiconductor material.

Figure 7:
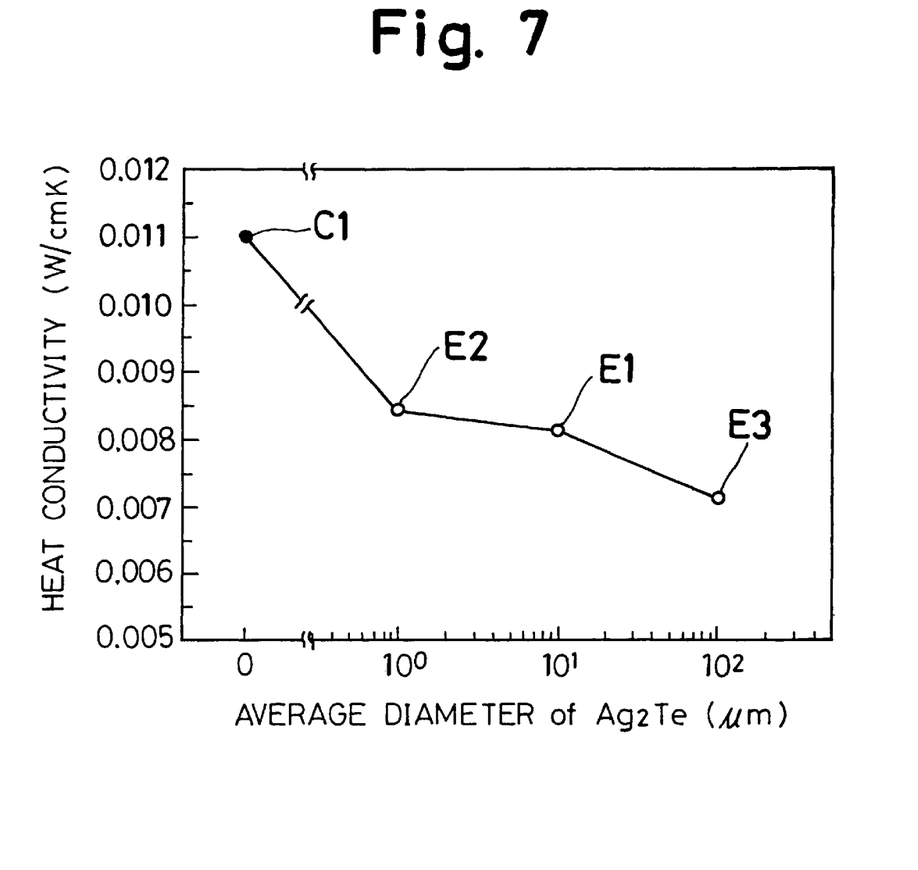
FIG. 7 shows a graph illustrating a relation between the average diameter of a dispersed particle and thermal conductivity in the second embodiment.

FIG. 7 shows the variations in thermal conductivity between C1, which is free of $Ag_2Te$ particles, and E1, E2 and E3, which contain particles of $Ag_2Te$ of various average diameters D ($\mu$m); and between E1, E2 and E3 as a function of average diameter of $Ag_2Te$ particles. The thermal conductivity of the thermoelectric semiconductor compound decreases when powders of the second thermoelectric semiconductor $Ag_2Te$ are introduced, and decreases with increasing average diameter of $Ag_2Te$ particles.

Figure 8:
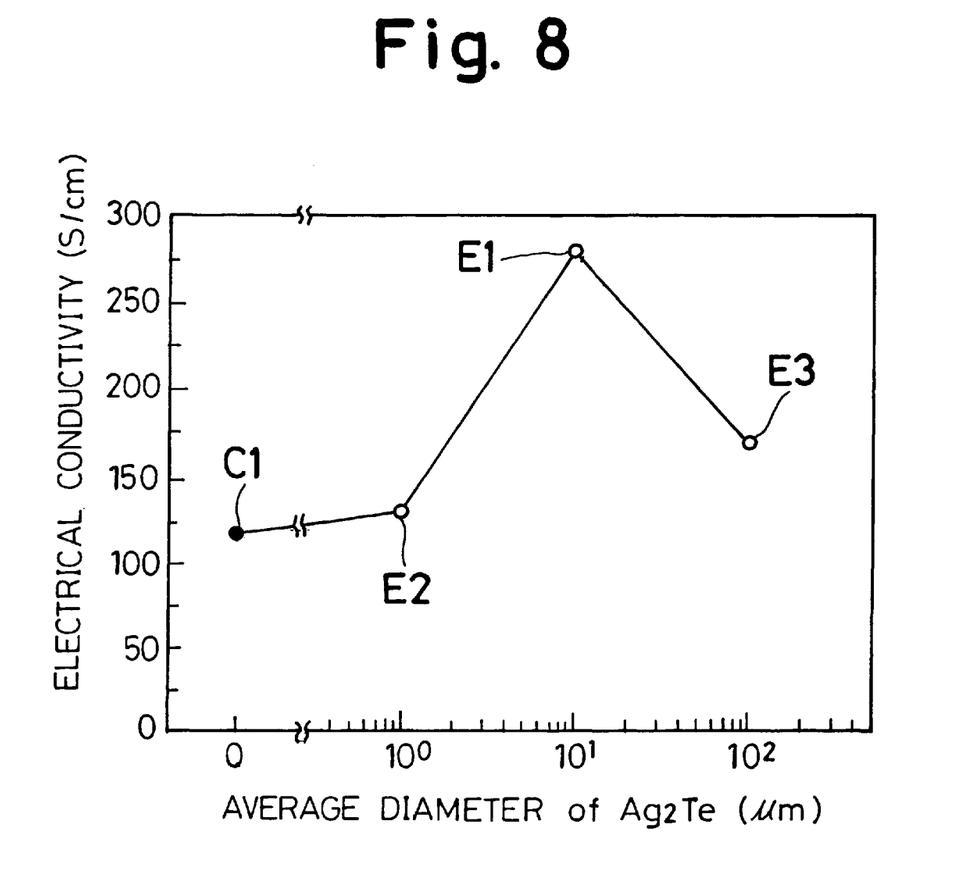
FIG. 8 shows a graph illustrating a relation between the average diameter of a dispersed particle and electric conductivity in the second embodiment.

FIG. 8 shows variations in electrical conductivity between C1 and E1, E2 and E3; and between E1, E2 and E3 as a function of average diameter of $Ag_2Te$ particles. E1 is found to be excellent in electric conductivity, while E2 and E3 are slightly inferior. This results in that the most preferable average diameter D seems to be in the vicinity of 10 $\mu$m.

Figure 9:
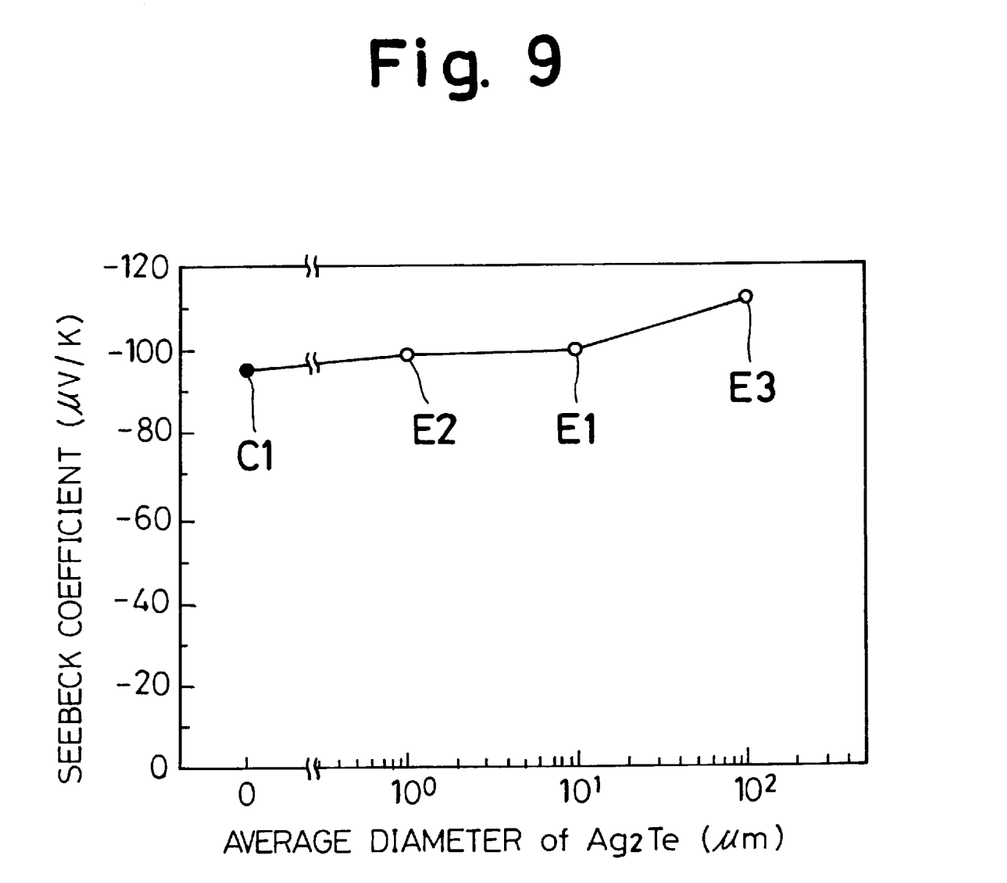
FIG. 9. shows a graph illustrating a relation between the average diameter of a dispersed particle and Seebeck coefficient in the second embodiment.

FIG. 9 shows variations in Seebeck coefficient between C1 and E1, E2 and E3; and between E1, E2 and E3 as a function of average diameter of $Ag_2Te$ particles. E1, E2, E3, and C1 are about equal This must be due to the fact that the particles are mutually isolated with each other, by which the Seebeck coefficient depends on the matrix.

Figure 10:
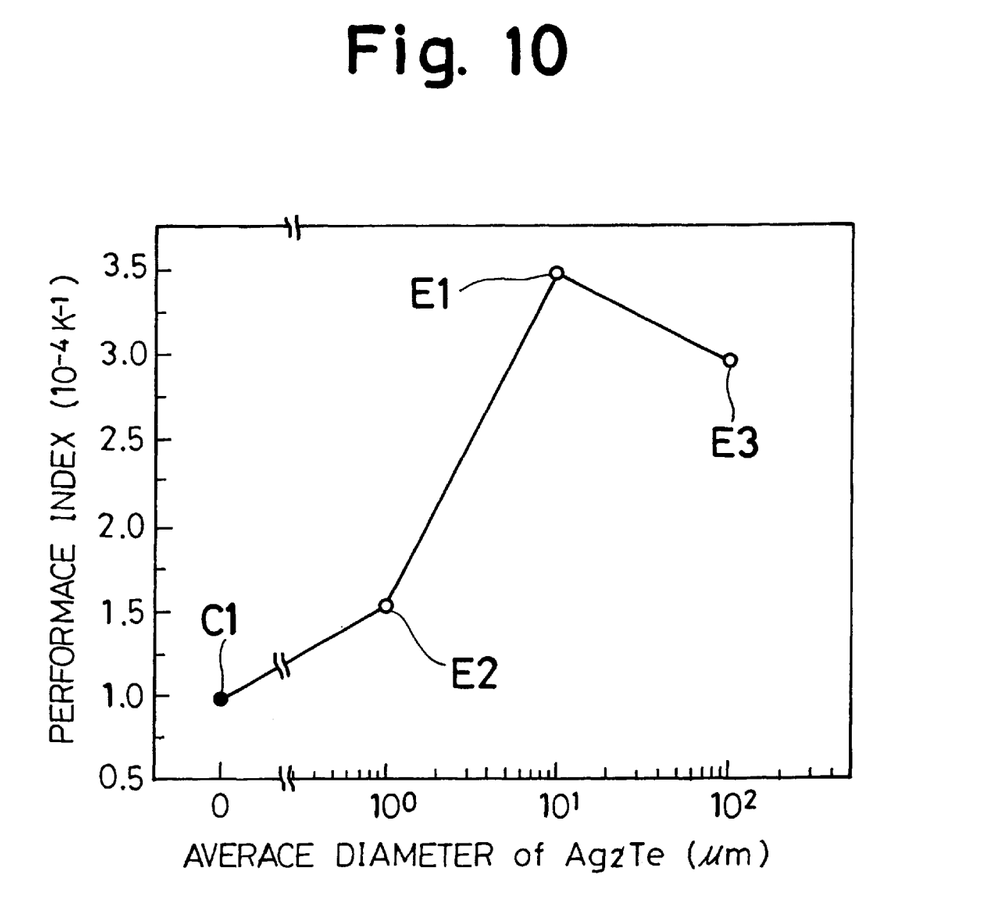
FIG. 10 shows a graph illustrating a relation between the average diameter of a dispersed particle and performance index Z in the second embodiment.

FIG. 10 shows variations in the performance index Z ($10^{-4}$ $K^{-1}$) between C1 and E1, E2 and E3; and between E1, E2 and E3 as a function of average diameter of $Ag_2Te$ particles. The performance index Z is calculated on the basis of the corresponding Seebeck coefficient, electric conductivity and thermal conductivity factors as mentioned above. When compared to C1, the performance index Z of each of E1, E2, and E3 is improved when the average diameter D of the $Ag_2Te$ particles falls within a range from 1 through 100 $\mu$m, especially in the neighborhood of 10 $\mu$m.

Thus, the present invention provides a thermoelectric semiconductor compound with a remarkably improved performance index Z achieved without degrading any of the factors of Z.

The invention has thus been shown and description with reference to specific embodiments, however, it should be understood that the invention is in no way limited to the details of the illustrated structures but changes and modifications may be made without departing from the scope of the appended claims.

The disclosure of the priority document, Application No. 10(1998)-336930, which was filed in Japan on Nov. 27, 1998, is incorporated by reference herein in its entirety.

What is claimed:

1. A thermoelectric semiconductor compound comprising:

a matrix comprising a first thermoelectric semiconductor; and particles of a second thermoelectric semiconductor dispersed in the matrix, wherein the first thermoelectric semiconductor and the second thermoelectric semiconductor include a common element; and A<D<B, where A is a mean free path of a carrier in a single crystal of the second thermoelectric semiconductor, D is an average diameter of the particles of the second thermoelectric semiconductor, and B is a mean free path of a long wavelength phonon in the single crystal of the second thermoelectric semiconductor.

2. The thermoelectric semiconductor compound according to claim 1, wherein D is in a range from 0.1 $\mu$m to 150 $\mu$m inclusive.

3. The thermoelectric semiconductor compound according to claim 1, wherein the common element is Te.

4. The thermoelectric semiconductor compound according to claim 3, wherein the first thermoelectric semiconductor comprises $AgBiTe_2$, and the second thermoelectric semiconductor comprises $Ag_2Te$.

5. The thermoelectric semiconductor compound according to claim 3, wherein the first thermoelectric semiconductor is a member of a $BiTe_3$ family of semiconductors.

6. The thermoelectric semiconductor compound according to claim 1, wherein a Seebeck coefficient of the first thermoelectric semiconductor is larger than a Seebeck coefficient of the second thermoelectric semiconductor.

7. A method for making a thermoelectric semiconductor compound, the method comprising:

mixing a raw material of a first thermoelectric semiconductor and a raw material of a second thermoelectric semiconductor to form a mixture, where
   the raw material of the first thermoelectric semiconductor and the raw material of the second thermoelectric semiconductor both include a common element,
   the first thermoelectric semiconductor melts at a first melting point,
   the second thermoelectric semiconductor melts at a second melting point, and
   the second melting point is higher than the first melting point;

melting the mixture at a temperature greater than the second melting point to form a melted mixture;

cooling the melted mixture to a temperature lower than the second melting point and higher than the first melting point to form a melted mixture containing crystallized particles of the second thermoelectric semiconductor; and cooling the melted mixture containing crystallized particles of the second thermoelectric semiconductor to a temperature lower than the first melting point to form a solid of the thermoelectric semiconductor compound.

8. The method according to claim 7, wherein A<E<B, where

A is a mean free path of a carrier in a single crystal of the second thermoelectric semiconductor;

E is an average diameter of the crystallized particles of the second thermoelectric semiconductor; and B is a mean free path of a long wavelength phonon in the single crystal of the second thermoelectric semiconductor.

9. The method according to claim 8, wherein E is in a range from 0.1 $\mu$m to 150 $\mu$m inclusive.

10. The method according to claim 7, wherein the common element is Te.

11. The method according to claim 10, wherein the first thermoelectric semiconductor comprises $AgBiTe_2$, and the second thermoelectric semiconductor comprises $Ag_2Te$.

12. The method according to claim 10, wherein the first thermoelectric semiconductor is a member of a $BiTe_3$ family of semiconductors.

13. The method according to claim 7, wherein a Seebeck coefficient of the first thermoelectric semiconductor is larger than a Seebeck coefficient of the second thermoelectric semiconductor.

14. A method of using a thermoelectric semiconductor compound, the method comprising passing an electric current through the thermoelectric semiconductor compound of claim 1.

15. A method of using a thermoelectric semiconductor compound, the method comprising creating a temperature difference between opposing sides of the thermoelectric semiconductor compound of claim 1.

* * * * *